United States Patent
DeBrosse et al.

(10) Patent No.: US 10,115,450 B1
(45) Date of Patent: Oct. 30, 2018

(54) CASCODE COMPLIMENTARY DUAL LEVEL SHIFTER

(71) Applicant: INTERNATIONAL BUSINESS MACHINES CORPORATION, Armonk, NY (US)

(72) Inventors: John K. DeBrosse, Colchester, VT (US); Yutaka Nakamura, Kita-ku (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/617,020

(22) Filed: Jun. 8, 2017

(51) Int. Cl.
*G11C 5/14* (2006.01)
*G11C 11/408* (2006.01)
*H03K 3/356* (2006.01)

(52) U.S. Cl.
CPC ...... *G11C 11/4082* (2013.01); *G11C 11/4085* (2013.01); *H03K 3/356104* (2013.01)

(58) Field of Classification Search
CPC .. G11C 5/147–5/148; H03K 3/356104; H03K 19/018528
See application file for complete search history.

(56) References Cited

U.S. PATENT DOCUMENTS

| | | | | |
|---|---|---|---|---|
| 4,845,381 A * | 7/1989 | Cuevas | ............ | H03K 3/356113 326/63 |
| 5,394,374 A * | 2/1995 | Ishimura | ............ | G11C 7/06 365/189.11 |
| 5,786,711 A * | 7/1998 | Choi | ............ | H03K 19/0016 326/17 |
| 5,844,767 A * | 12/1998 | Komiya | ............ | G11C 5/145 365/189.11 |
| 6,288,951 B1 * | 9/2001 | Chen | ............ | G11C 5/145 365/189.09 |
| 6,894,537 B1 * | 5/2005 | Wert | ............ | H03K 3/356113 326/63 |
| 7,199,617 B1 * | 4/2007 | Schrom | ............ | H03K 19/018528 326/68 |
| 7,468,615 B1 * | 12/2008 | Tan | ............ | H03K 19/00315 326/68 |
| 7,847,590 B2 | 12/2010 | Pamperin | | |
| 7,994,819 B2 | 8/2011 | Al-Shyoukh et al. | | |
| 8,283,965 B2 | 10/2012 | Alam | | |
| 8,912,823 B2 | 12/2014 | Rao et al. | | |
| 8,994,402 B2 | 3/2015 | Hwang et al. | | |

(Continued)

OTHER PUBLICATIONS

Kossel et al., "A 5.7mW/Gb/s 24-to-240Ω 1.6Gb/s Thin-Oxide DDR Transmitter with 1.9-to-7.6V/ns Clock-Feathering Slew-Rate Control in 22nm CMOS", 17.3, International Solid-State Circuits Conference, Feb. 20, 2013, Session 17, pp. 309-311.

(Continued)

*Primary Examiner* — Hoai V Ho
*Assistant Examiner* — Jay Radke
(74) *Attorney, Agent, or Firm* — L. Jeffrey Kelly

(57) ABSTRACT

A level shifter and dynamic random-access memory that includes a first output terminal and a second output terminal. A first voltage or a third voltage is outputted from the first output terminal. A second voltage or a fourth voltage is outputted from the second output terminal. The second voltage is lower than the first voltage. The third voltage is lower than the first voltage and higher than the second voltage. The fourth voltage is lower than the first voltage and higher than the third voltage.

17 Claims, 9 Drawing Sheets

VPP > VDD > VMID > VSS

(56) References Cited

U.S. PATENT DOCUMENTS

| | | | |
|---|---|---|---|
| 9,621,135 B1* | 4/2017 | Ozbas | G06F 3/0416 |
| 9,654,087 B1 | 5/2017 | Feldtkeller | |
| 9,755,621 B1 | 9/2017 | Sinha et al. | |
| 2007/0097756 A1 | 5/2007 | Hirota et al. | |
| 2008/0007315 A1* | 1/2008 | Huang | H03K 19/01852 |
| | | | 327/333 |
| 2008/0238522 A1 | 10/2008 | Thorp et al. | |
| 2009/0278586 A1* | 11/2009 | Chen | H03K 17/22 |
| | | | 327/333 |
| 2010/0061164 A1 | 3/2010 | Tandon et al. | |
| 2011/0001538 A1 | 1/2011 | Alam | |
| 2011/0204953 A1* | 8/2011 | Kang | H03K 3/356113 |
| | | | 327/333 |
| 2013/0027082 A1* | 1/2013 | Sofer | H03K 3/356113 |
| | | | 326/80 |
| 2016/0173096 A1* | 6/2016 | Inoue | H03K 19/01852 |
| | | | 327/333 |
| 2016/0173097 A1* | 6/2016 | Inoue | H03K 19/01852 |
| | | | 327/333 |
| 2016/0294373 A1* | 10/2016 | Grubelich | H03K 3/356104 |

OTHER PUBLICATIONS

Llanos et al., "Energy-Efficient Level Shifter Topology", 2015 IEEE, PGMICRO, PPGC, Instituto de Informática, Federal University of Rio Grande do Sul (UFRGS), Porto Alegre, Brazil, pp. 148-151.

Pashmineh et al., "Self-Biasing High-Voltage Driver Based on Standard CMOS with an Adapted Level Shifter for a Wide Range of Supply Voltages", Department Microelectronics, Brandenburg University of Technology, Cottbus, 03046, Germany, 2015 IEEE, 4 pages.

IBM: List of IBM Patents or Patent Applications Treated As Related (Appendix P), Feb. 28, 2018, 2 pages.

Pending U.S. Appl. No. 15/906,345, filed Feb. 27, 2018, entilted: "Cascode Complimentary Dual Level Shifter", 44 pages.

* cited by examiner

CASCODE COMPLIMENTARY DUAL LEVEL SHIFTER

BACKGROUND

The present invention relates generally to the field of level shifters, and more particularly to a cascode complementary dual level shifter.

CMOS technologies include thin- and thick-oxide field-effect transistors ("FET(s)") to deal with regular drain supply voltage ("VDD"), for example, 0.8V, and high peak to peak voltage ("VPP"), for example, 1.6V. At around a 14 nm technology node, the FET type was changed to fin from planar to scale further, which may result in thin-oxide FET only circuits to reduce significantly increased manufacturing and development costs. Cascode methods enable thin-oxide FET only circuits to shift between regular and high voltage. A cross-coupled inverter gate ("INV") may be vulnerable to metastability, associated with poor cascade p-channel FET ("PFET") pull-up current capability, where there is a low absolute gate-to-source voltage ("Vgs"). This Vgs may cause the pFET to malfunction or get stacked an undesired state. It may be advantageous to mitigate issues in poor performing FETs or FETs stacked in an undesired state.

SUMMARY

According to an embodiment of the present invention, a level shifter including a first circuit section, a second circuit section, and an inverter is provided. The second circuit section is in parallel with the first circuit section. The inverter is provided between the first circuit section and the second circuit section. The first circuit section includes a first p-channel field effect transistor (FET), a second p-channel FET, a first n-channel FET, a second n-channel FET, a third n-channel FET, a third p-channel FET, a fourth p-channel FET, and a first condenser. The first p-channel FET, the second p-channel FET, the first n-channel FET, and the second n-channel FET are connected to each other in series. A drain of the third n-channel FET is connected to a first connection point at which a drain of the first p-channel FET and a source of the second p-channel FET are connected to each other. A source of the third n-channel FET is connected to a gate of the second p-channel FET. A gate of the third p-channel FET is connected to a second connection point at which the source of the third n-channel FET and the gate of the second p-channel FET are connected to each other. A drain of the third p-channel FET is connected to a third connection point at which a drain of the second p-channel FET and a drain of the first n-channel FET are connected to each other. A source of the fourth p-channel FET is connected to a gate of the first n-channel FET. A drain of the fourth p-channel FET is connected to a fourth connection point at which a source of the first n-channel FET and a drain of the second n-channel FET are connected to each other. Ends of the first condenser are respectively connected to a fifth connection point at which the drain of the first p-channel FET and the source of the second p-channel FET are connected to each other, and a sixth connection point at which the source of the first n-channel FET and the drain of the second n-channel FET are connected to each other. The second circuit section includes a fifth p-channel FET, a sixth p-channel FET, a fourth n-channel FET, a fifth n-channel FET, a sixth n-channel FET, a seventh p-channel FET, an eighth p-channel FET, and a second condenser. The fifth p-channel FET, the sixth p-channel FET, the fourth n-channel FET, and the fifth n-channel FET are connected in series. A gate of the fifth p-channel FET is connected to the drain of the first p-channel FET. A drain of the fifth p-channel FET is connected to a gate of the first p-channel FET. A gate of the sixth p-channel FET is connected to the gate of the second p-channel FET. A gate of the fourth n-channel FET is connected to the gate of the first n-channel FET. A drain of the sixth n-channel FET is connected to a seventh connection point at which the drain of the fifth p-channel FET and a source of the sixth p-channel FET are connected to each other. A source of the sixth n-channel FET is connected to the gate of the sixth p-channel FET. A gate of the seventh p-channel FET is connected to an eighth connection point at which the source of the sixth n-channel FET and the gate of the sixth p-channel FET are connected to each other. A drain of the seventh p-channel FET is connected to a ninth connection point at which a drain of the sixth p-channel FET and a drain of the fourth n-channel FET are connected to each other. A source of the eighth p-channel FET is connected to the gate of the fourth n-channel FET. A drain of the eighth p-channel FET is connected to a tenth connection point at which a source of the fourth n-channel FET and a drain of the fifth n-channel FET are connected to each other. Ends of the second condenser are respectively connected to an eleventh connection point at which the drain of the fifth p-channel FET and the source of the sixth p-channel FET are connected to each other, and a twelfth connection point at which the source of the fourth n-channel FET and the drain of the fifth n-channel FET are connected to each other. An inverter input terminal of the inverter is connected to a gate of the fourth p-channel FET and a gate of the second n-channel FET. An inverter output terminal of the inverter is connected to a gate of the eighth p-channel FET and a gate of the fifth n-channel FET. The seventh connection point constitutes a first output terminal. The tenth connection point constitutes a second output terminal. A first voltage is applied to a source of the first p-channel FET and a source of the fifth p-channel FET. A second voltage being lower than the first voltage is applied to a source of the second n-channel FET and a source of the fifth n-channel FET. The first voltage or a third voltage being lower than the first voltage and higher than the second voltage is outputted from the first output terminal. The second voltage or a fourth voltage being lower than the first voltage and higher than the third voltage is outputted from the second output terminal.

According to another embodiment of the present invention, there is provided a dynamic random-access memory (DRAM) including plural memories, a driver, and a level shifter. The plural memories are arranged in an array. Each of the memories has at least an access field-effect transistor (FET) and a storage capacitance. The driver is for driving the memories. The driver is coupled to each gate of the corresponding memories. The level shifter is for sifting a voltage level to apply a voltage to the driver. The level shifter includes a first circuit section, a second circuit section, and an inverter. The second circuit section is in parallel with the first circuit section. The inverter is provided between the first circuit section and the second circuit section. The first circuit section includes a first p-channel field effect transistor (FET), a second p-channel FET, a first n-channel FET, a second n-channel FET, a third n-channel FET, a third p-channel FET, a fourth p-channel FET, and a first condenser. The first p-channel FET, the second p-channel FET, the first n-channel FET, and the second n-channel FET are connected to each other in series. A drain of the third n-channel FET is connected to a first connection point at which a drain of the first p-channel FET and a source of the second p-channel FET are connected to each other. A source of the third n-channel FET is connected to a gate of the second p-channel FET. A gate of the third p-channel FET is connected to a second connection point at which the source of the third n-channel FET and the gate of the second p-channel FET are connected to each other. A drain of the third p-channel FET is connected to a third connection point at which a drain of the second p-channel FET and a drain of the first n-channel FET are connected to each other. A source of the fourth p-channel FET is connected to a gate of the first n-channel FET. A drain of the fourth p-channel FET is connected to a fourth connection point at which a source of the first n-channel FET and a drain of the second n-channel FET are connected to each other. Ends of the first condenser are respectively connected to a fifth connection point at which the drain of the first p-channel FET and the source of the second p-channel FET are connected to each other, and a sixth connection point at which the source of the first n-channel FET and the drain of the second n-channel FET are connected to each other. The second circuit section includes a fifth p-channel FET, a sixth p-channel FET, a fourth n-channel FET, a fifth n-channel FET, a sixth n-channel FET, a seventh p-channel FET, an eighth p-channel FET, and a second condenser. The fifth p-channel FET, the sixth p-channel FET, the fourth n-channel FET, and the fifth n-channel FET are connected in series. A gate of the fifth p-channel FET is connected to the drain of the first p-channel FET. A drain of the fifth p-channel FET is connected to a gate of the first p-channel FET. A gate of the sixth p-channel FET is connected to the gate of the second p-channel FET. A gate of the fourth n-channel FET is connected to the gate of the first n-channel FET. A drain of the sixth n-channel FET is connected to a seventh connection point at which the drain of the fifth p-channel FET and a source of the sixth p-channel FET are connected to each other. A source of the sixth n-channel FET is connected to the gate of the sixth p-channel FET. A gate of the seventh p-channel FET is connected to an eighth connection point at which the source of the sixth n-channel FET and the gate of the sixth p-channel FET are connected to each other. A drain of the seventh p-channel FET is connected to a ninth connection point at which a drain of the sixth p-channel FET and a drain of the fourth n-channel FET are connected to each other. A source of the eighth p-channel FET is connected to the gate of the fourth n-channel FET. A drain of the eighth p-channel FET is connected to a tenth connection point at which a source of the fourth n-channel FET and a drain of the fifth n-channel FET are connected to each other. Ends of the second condenser are respectively connected to an eleventh connection point at which the drain of the fifth p-channel FET and the source of the sixth p-channel FET are connected to each other, and a twelfth connection point at which the source of the fourth n-channel FET and the drain of the fifth n-channel FET are connected to each other. An inverter input terminal of the inverter is connected to a gate of the fourth p-channel FET and a gate of the second n-channel FET. An inverter output terminal of the inverter is connected to a gate of the eighth p-channel FET and a gate of the fifth n-channel FET. The seventh connection point constitutes a first output terminal. The tenth connection point constitutes a second output terminal. A first voltage is applied to a source of the first p-channel FET and a source of the fifth p-channel FET. A second voltage being lower than the first voltage is applied to a source of the second n-channel FET and a source of the fifth n-channel FET. The first voltage or a third voltage being lower than the first voltage and higher than the second voltage is outputted from the first output terminal. The second voltage or a fourth voltage being lower than the first voltage and higher than the third voltage is outputted from the second output terminal.

DETAILED DESCRIPTION

Hereinafter, exemplary embodiments of the present invention will be described in detail with reference to the attached drawings.

It is to be noted that the present invention is not limited to these exemplary embodiments to be given below and may be implemented with various modifications within the scope of the present invention. In addition, the drawings used herein are for purposes of illustration, and may not show actual dimensions.

The miniaturization of a field effect transistor (FET) has been advanced continuously for higher integration and higher performance of an integrated circuit. The size of the FET may be reduced according to a so-called scaling law. In the scaling law, a gate oxide film thickness of the FET gets thinner as generations, i.e. technology nodes, change. For example, there is a generation called 14 nm technology node, in which the thickness of the gate oxide film of the FET is about 1.2 nm and the gate length of the FET is about 20 nm. A technology node area of this generation is about 196 nm^2. In this technology node, an allowable voltage for the FET is 0.8 V, for example. The allowable voltage may be used to refer to a voltage which is constantly applicable to the FET without affecting the lifetime thereof.

Hereinafter, the term "thin-oxide technology" will be used to refer to the technology of a subject technology node. The term "thick-oxide technology" will be used to refer to the technology of a previous technology node which is a technology node one or more nodes before the subject technology node. Note that the allowable voltage for the thin-oxide technology is lower than that for the thick-oxide technology.

Figure 1:
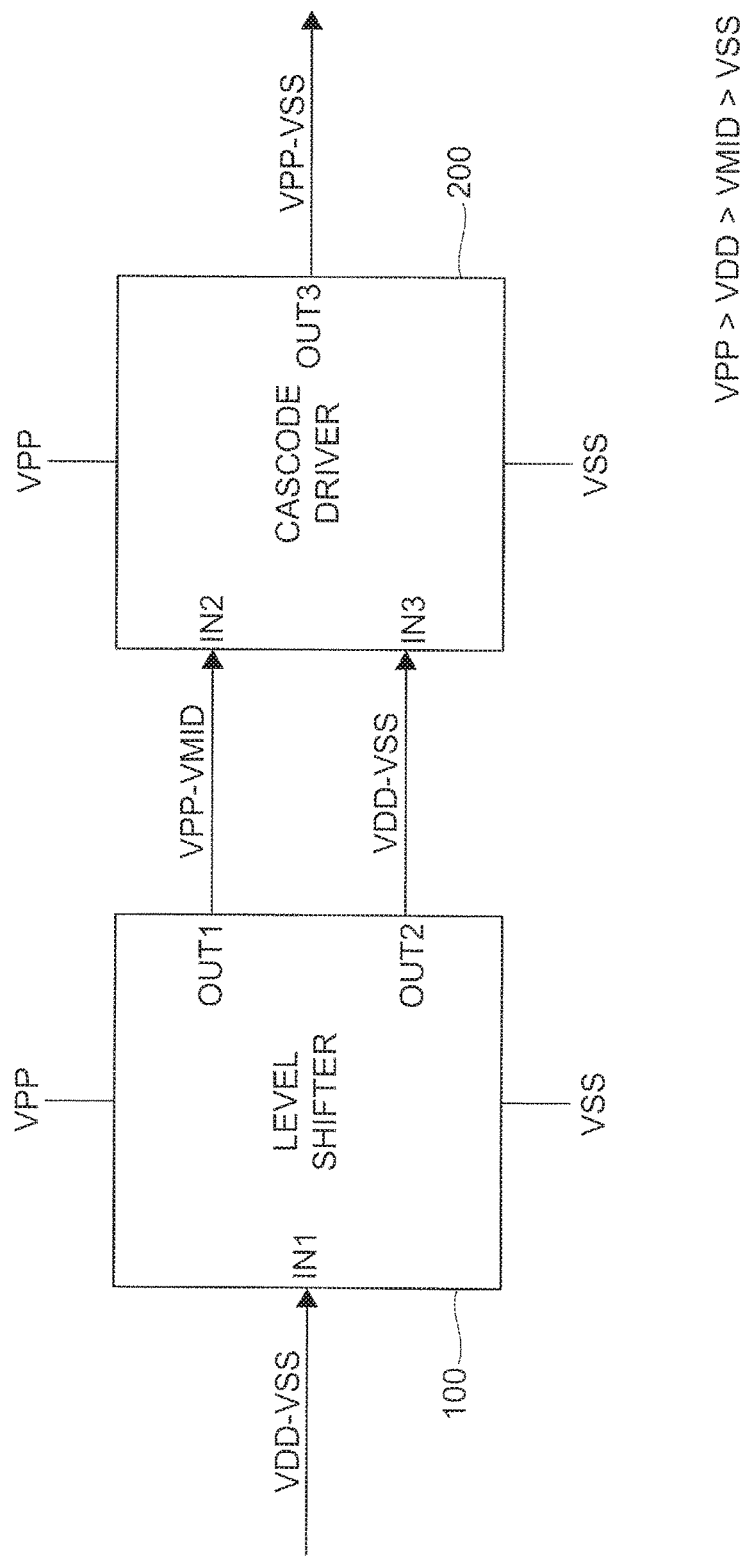
FIG. 1 is a block diagram of a level shifter and a cascode driver driven by the level shifter according to an embodiment of the present invention.

FIG. 1 is a block diagram of a level shifter 100 and a cascode driver 200 driven by the level shifter 100 according to an embodiment of the present invention. The reference voltage VSS is the base voltage. A voltage being higher than the reference voltage is expressed as a low voltage VDD (VDD>VSS). A voltage being higher than the low voltage VDD is expressed as a high voltage VPP (VPP>VDD). Further, a voltage being between the low voltage VDD and the reference voltage VSS is expressed as a middle voltage VMID (VDD>VMID>VSS). The high voltage VPP is an example of a first voltage. The reference voltage VSS is an example of a second voltage. The middle voltage VMID is an example of a third voltage. The low voltage VDD is an example of a forth voltage.

The low voltage VDD may be constantly applicable to the device without shortening a lifetime of the device. On the other hand, if the high voltage VPP is applied to the device constantly or for a long time, the lifetime of the device may be shortened. Hereinafter, an allowable voltage being appropriate for a device constituted with the thin-oxide technology may be referred to as a difference voltage between a low voltage VDD and a reference voltage VSS. Because the reference voltage VSS is usually set to 0 V, the low voltage is the allowable voltage.

The cascode driver 200 is a word line (W/L) driver for a memory, such as a dynamic random access memory (DRAM). In this example, an access device included in a memory cell of the memory is constituted with the thin-oxide technology. The access device may be a field effect transistor (FET). A breakdown between terminals of the FET, such as the gate, the source, and the drain, may shorten the lifetime of the FET.

In the case that the FET has a silicon-on-insulator (SOI) structure, the breakdown voltage between the gate and the source and the breakdown voltage between the gate and the drain are lower than the breakdown voltage between the source and the drain.

In the case that the FET has a bulk structure, a breakdown between the gate and the body is added to the SOI structure. However, the breakdown voltage between the gate and the body may be higher than each of the breakdown voltages between the gate and the source and between the gate and the drain, because a depletion layer is formed in the body.

In various embodiments, the access device may be an SOI FET. Applying the high voltage VPP to the gate of the FET with reducing ON-resistance of the FET enables to flow a large current for improving an access speed to the memory cell. In this configuration, an application time of the high voltage VPP to the FET is set short to such a degree that an influence on the lifetime of the device can be ignored.

In this example, an output signal (output signal OUT3, described later) from the cascode driver 200 switches the voltages between the high voltage VPP and the reference voltage VSS. In other words, the output signal OUT3 has amplitude (VPP-VSS). Note that the amplitude of the output signal OUT3 may be expressed as OUT3 (VPP-VSS). The same expression is applied to other amplitudes.

The cascode driver 200 receives multiple input signals, i.e. an input signal IN2 having amplitude (VPP-VMID) and an input signal IN3 having amplitude (VPP-VSS). The cascode driver 200 generates the output signal OUT3 with the input signal IN2 and the input signal IN3.

The level shifter 100 receives an input signal IN1 having amplitude (VDD-VSS) to generate and output an output signal OUT1 (the input signal IN2) having the amplitude (VPP-VMID) and an output signal OUT2 (the input signal IN3) having the amplitude (VDD-VSS).

The level shifter 100 receives the input signal IN1 having the amplitude (VDD-VSS) and outputs the output signal OUT1 having the amplitude (VPP-VMID) and the output signal OUT2 having the amplitude (VDD-VSS). This means that the level shifter 100 shifts the amplitude (VDD-VSS) to the amplitude (VPP-VMID).

Figure 2:
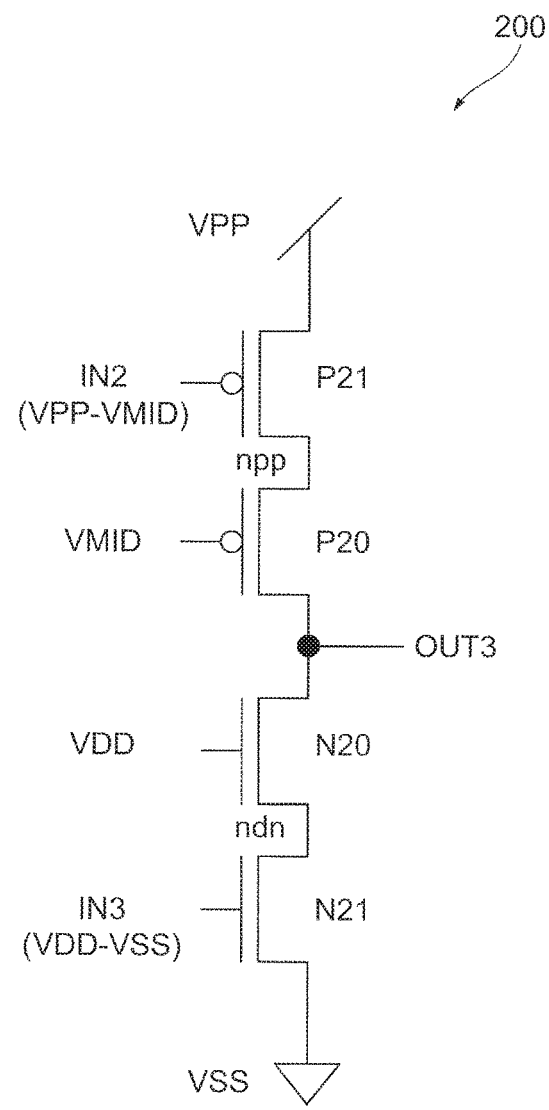
FIG. 2 is a circuit diagram of the cascode driver.

FIG. 2 is a circuit diagram of the cascode driver 200. As shown in FIG. 2, the cascode driver 200 may include two p-channel FETs P20, P21 and two n-channel FETs, N20, N21.

The drain of the FET P21 is coupled to the source of the FET P20. The source of the FET N20 is coupled to the drain of the FET N21. The drain of the FET P20 is coupled to the drain of the FET N20. Further, the high voltage VPP is applied to the source of the FET P21. The reference voltage VSS is applied to the source of the FET N21.

The middle voltage VMID is constantly applied to the gate of the FET P20 so that the FET P20 is constantly in ON state. The low voltage VDD is constantly applied to the gate of the FET N20 so that the FET N20 is constantly in ON state.

Further, the input signals IN2, IN3 are fed into the cascode driver 200. The input signal IN2 is fed into the gate of the FET P21. The input signal IN2 is switched between the high voltage VPP and the middle voltage VMID. In other words, the input signal IN2 has amplitude (VPP-VMID). The input signal IN3 is fed into the gate of the FET N21. The input signal IN3 is switched between the low voltage VDD and the reference voltage VSS. In other words, the input signal IN3 has amplitude (VDD-VSS).

A connection point of the drain of the FET P20 and the drain of the FET N20 is an output point for outputting the output signal OUT3.

Hereinafter, the operation of the cascode driver 200 will be explained. In various embodiments, the voltages may be as follows, for example: the high voltage VPP is 1.4 V, the low voltage VDD is 0.8 V, the reference voltage VSS is 0 V, and the middle voltage VMID is 0.6 V. A threshold voltage of the p-channel FETs P20, P21 may be, for example, −0.2 V and a threshold voltage of the n-channel FETs, N20, N21 may be, for example, 0.2 V. Note that the middle voltage VMID can be set as VMID=VPP−VDD to gain the middle voltage VMID with a simple operation.

The FET P20 with the gate constantly applied with the middle voltage VMID is in ON state but the FET P20 is not in a sufficient ON state. In other words, the FET P20 is in a weak ON state. The FET N20 with the gate constantly applied with the low voltage VDD is in the sufficient ON state. In other words, the FET N20 is in a strong ON state.

Figure 3:
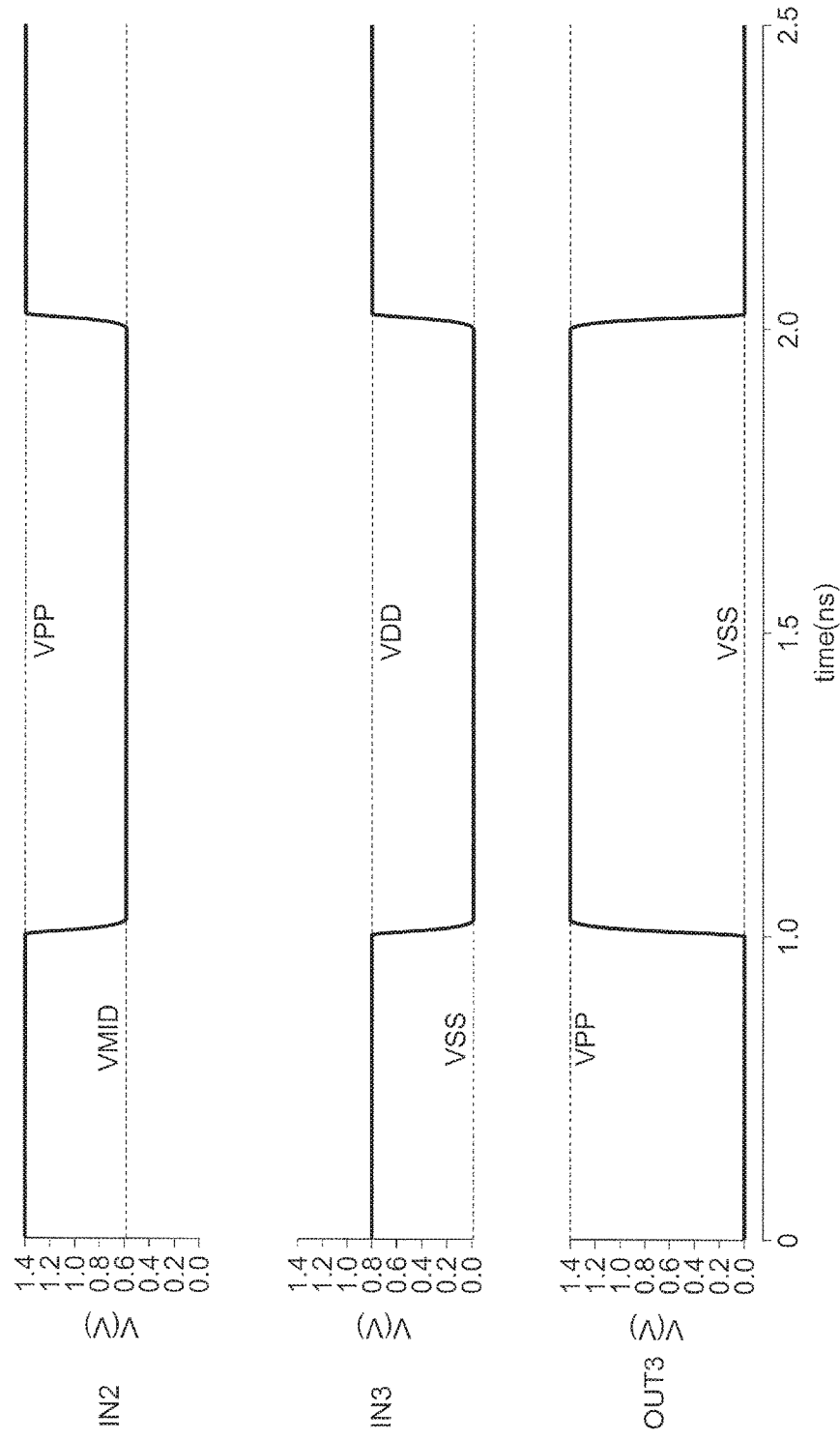
FIG. 3 is a timing chart of the operation of the cascode driver according to the embodiment.

FIG. 3 is a timing chart of the operation of the cascode driver 200 according to the embodiment. The horizontal axis indicates time (ns). The vertical axis indicates voltages of the input signals IN2, IN3 and the output signal OUT3. In the example, the cascode driver 200 outputs the high voltage VPP (1.4 V) in a period from 1.0 ns to 2.0 ns and the reference voltage VSS (0 V) in the other period.

Referring to FIG. 2 and FIG. 3, the operation of the cascode driver 200 will be explained in detail.

At time 0.0 ns, the input signal IN2 is the high voltage VPP (1.4 V) and the input signal IN3 is the low voltage VDD (0.8 V).

The FET P21 with the gate applied with the input signal IN2 (1.4 V) is in OFF state. The FET N21 with the gate applied with the input signal IN3 (0.8 V) is in ON state.

Since the FET P21 is in the OFF state, the high voltage VPP is not outputted as the output signal OUT3 even if the FET P20 is in the ON state. On the other hand, the FET N21 and the FET N20 are in the ON state, so that the output signal OUT3 becomes the reference voltage VSS (0 V).

Since the middle voltage VMID (0.6 V) is applied to the gate of the FET P20, a voltage of a connection point npp between the drain of the FET P21 and the source of the FET P20 is maintained equal to the voltage VMID (0.6 V) of the gate, if the connection point npp has been applied with 1.4 V.

Since the FET N21 is in the sufficient ON state, a voltage of a connection point ndn between the drain of the FET N21 and the source of the FET N20 is 0 V, i.e. the gate of the FET N21 is applied with the low voltage VDD (0.8 V). The FET N20 is in the sufficient ON state, as explained above.

Since the FET N21 and the FET N20 are in the sufficient ON state, the output signal OUT3 becomes 0 V.

The high voltage VPP is applied to the source of the FET P21, so that the high voltage VPP is supposed to be applied to the FETs constituting the cascode driver 200. Hereinafter, the voltages in a steady state will be explained. The term "steady state" will be used to refer to a state after a transitional state in which the voltage changes.

In the FET P21, a voltage between the gate (IN2: 1.4 V) and the source (VPP: 1.4 V), i.e. a gate-to-source voltage, is 0 V, a voltage between the gate (IN2: 1.4 V) and the drain (npp: 0.6 V), i.e. a gate-to-drain voltage, is 0.8 V, and a voltage between the source (VPP: 1.4 V) and the drain (npp: 0.6 V), i.e. a source-to-drain voltage, is 0.8 V.

In the FET P20, a voltage between the gate (VMID: 0.6 V) and the source (npp: 0.6 V) is 0 V, a voltage between the gate (VMID: 0.6 V) and the drain (OUT3: 0 V) is 0.6 V, and a voltage between the source (npp: 0.6 V) and the drain (OUT3: 0 V) is 0.6 V.

In the FET N21, a voltage between the gate (IN3: 0.8 V) and the source (VSS: 0 V) is 0.8 V, a voltage between the gate (IN3: 0.8 V) and the drain (ndn: 0 V) is 0.8 V, and a voltage between the source (VSS: 0 V) and the drain (ndn: 0 V) is 0 V.

In the FET N20, a voltage between the gate (VDD: 0.8 V) and the source (ndn: 0 V) is 0.8 V, a voltage between the gate (VDD: 0.8 V) and the drain (OUT3: 0 V) is 0.8 V, and a voltage between the source (ndn: 0 V) and the drain (OUT3: 0 V) is 0 V.

As mentioned above, at time 0.0 ns every voltage between the gate and the source, the gate and the drain, and the source and the drain of the all FETs included in the cascode driver 200 is equal to or less than the low voltage VDD (0.8 V), which is an allowable voltage for the thin-oxide technology.

At time 1.0 ns, the input signal IN2 is switched from the high voltage VPP (1.4 V) to the middle voltage VMID (0.6 V), and the input signal IN3 is switched from low voltage VDD (0.8 V) to the reference voltage VSS (0 V).

The FET N21 with the gate applied with the input signal IN3 (0 V) is turned OFF. This stops outputting the reference voltage VSS. On the other hand, the FET P21 with the gate applied with the input signal IN2 (0.6 V) is turned ON. The FET P20 is in the ON state. Because the FET P20 and the FET P21 are in the ON state, this switches the output signal OUT3 from the reference voltage VSS (0 V) to the high voltage VPP (1.4 V) via the rail passing through the FET P21 and the FET P20.

Then the voltage of the connection point npp changes from the middle voltage VMID (0.6 V) to the high voltage VPP (1.4 V).

Since the FET N20 is in the ON state, the voltage of the connection point ndn changes from the reference voltage VSS (0 V) to the low voltage VDD (0.8 V), which is the gate voltage of the FET N20.

In the FET P21, the voltage between the gate (IN2: 0.6 V) and the source (VPP: 1.4 V) is 0.8 V, the voltage between the gate (IN2: 0.6 V) and the drain (npp: 1.4 V) is 0.8 V, and the voltage between the source (VPP: 1.4 V) and the drain (npp: 1.4 V) is 0 V.

In the FET P20, the voltage between the gate (VMID: 0.6 V) and the source (npp: 1.4 V) is 0.8 V, the voltage between the gate (VMID: 0.6 V) and the drain (OUT3: 1.4 V) is 0.8 V, and the voltage between the source (npp: 1.4 V) and the drain (OUT3: 1.4 V) is 0 V.

In the FET N21, the voltage between the gate (IN3: 0 V) and the source (VSS: 0 V) is 0 V, the voltage between the gate (IN3: 0 V) and the drain (ndn: 0.8 V) is 0.8 V, and the voltage between the source (0 V) and the drain (ndn: 0.8 V) is 0.8 V.

In the FET N20, the voltage between the gate (VDD: 0.8 V) and the source (ndn: 0.8 V) is 0 V, the voltage between the gate (VDD: 0.8 V) and the drain (OUT3: 1.4 V) is 0.6 V, and the voltage between the source (ndn: 0.8 V) and the drain (OUT3: 1.4 V) is 0.6 V.

As mentioned above, at time 1.0 ns every voltage between the gate and the source, the gate and the drain, and the source and the drain of all FETs included in the cascode driver 200 is equal to or less than the low voltage VDD (0.8 V), which is an allowable voltage for the thin-oxide technology.

At time 2.0 ns, the input signal IN2 is switched from the middle voltage VMID (0.6 V) to the high voltage VPP (1.4 V), and the input signal IN3 is switched from the reference voltage VSS (0 V) to the low voltage VDD (0.8 V).

This condition is the same as at time 0.0 ns. More specifically, the output signal OUT3 becomes the reference voltage VSS (0 V). The FET P21 is in the OFF state, and the FET N21 is in the ON state. The FET P20 and the FET N20 are constantly in the ON state.

After time 2.0 ns, the condition at time 0.0 ns and the condition at time 1.0 ns may be repeated. The cascode driver 200 prevents the FETs constituting the cascode driver 200 from being applied with the high voltage VPP between the gate and the source, between the gate and the drain, and between the source and the drain in the respective devices.

In other words, the FET P21 and the FET N21 in cascode driver 200 constitute an inverter circuit. The FET P20 and the FET N20 are the so called cascode devices provided between the FET P21 and the FET N21.

The FET P20 protects the FET P21, preventing the application of the high voltage VPP to the FET P21 directly when the output signal OUT3 is the reference voltage VSS.

The FET N20 protects the FET N21, preventing the application of the high voltage VPP to the FET N21 directly when the output signal OUT3 is the high voltage VPP.

The cascode devices may disperse the high voltage VPP to prevent the application of the high voltage VPP to each of the FETs P20, P21, N20, and N21.

It should be appreciated that the FET P20 and the FET N20 constituting the cascode devices are constantly in the ON state. The cascade driver 200 then needs the input signal IN2 having the amplitude (VPP-VMID) and the input signal IN3 having the amplitude (VDD-VSS). Especially, the input signal IN2 having the amplitude (VPP-VMID) is required to be shifted from the reference voltage VSS (0 V). The level shifter 100 may be required to generate the signal of the input signal IN2 having the amplitude (VPP-VMID).

Figure 4:
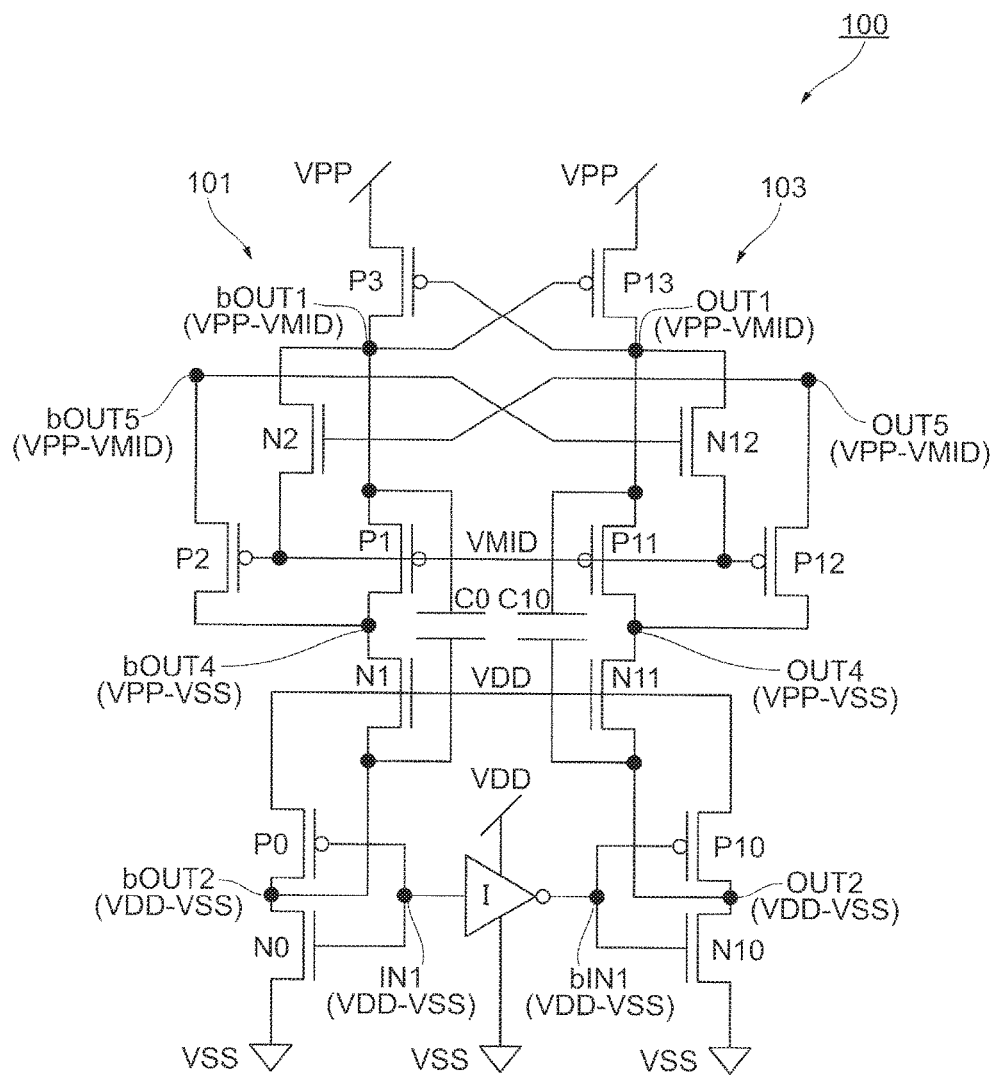
FIG. 4 is a circuit diagram of a level shifter according to an embodiment of the present invention.

FIG. 4 is a circuit diagram of a level shifter 100 according to an embodiment of the present invention. Referring to FIG. 4, the level shifter 100 will be explained in detail.

The level shifter 100 shown in FIG. 4 is constituted symmetrically. The level shifter 100 may include four p-channel FETs P0, P1, P2, P3, three n-channel FETs N0, N1, N2, and one condenser C0 on the left side. The level shifter 100 may also include four p-channel FETs P10, P11, P12, P13, three n-channel FETs N10, N11, N12, and one condenser C10 on the right side. Further, the level shifter 100 may also include an inverter I.

Note that the devices on the left side of the FIG. 4, i.e. a first circuit section 101, is labeled with a single digit number (e.g. 0 as in the FET P0) while the devices on the right side of the FIG. 4, i.e. a second circuit section 103, is labeled with a number being the single digit number plus 10 (e.g. 10 as in the FET P10).

Hereinafter, the devices on the left side will be mainly explained. The character of "b" means a complementary relation between a term without "b" and a term with "b".

An inverter circuit is constituted by the FET P0 and the FET N0. The drain of the FET N0 is coupled to the drain of the FET P0. The reference voltage VSS is applied to the source of the FET N0.

An inverter circuit may be constituted by the FET P1 and the FET N1. The drain of the FET N1 is coupled to the drain of the FET P1. The source of the FET N1 is coupled to a connection point between the drain of the FET N0 and the drain of the FET P0 constituting the inverter circuit. The source of the FET P1 is coupled to the drain of the FET P3. Further, the high voltage VPP is applied to the source of the FET P3.

The source of the FET P0 is coupled to the gate of the FET N1. Note that the gate of the FET N1 is coupled to the gate of the FET N11 in the symmetric position.

The drain of the FET P2 is coupled to a connection point between the drain of the FET N1 and the drain of the FET P1 constituting the inverter circuit.

The gate of the FET P1 is coupled to the gate of the FET P2. Note that the gates of the FET P1 and the FET P2 are coupled to the corresponding gates of the FET P11 and the FET P12 in the symmetric positions.

The source of the FET P2 is coupled to the gate of the FET N12 on the right side. The source of FET N12 is coupled to the gate of the FET N2 on the left side.

The source of the FET N2 is coupled to the gate of the FET P2. The drain of the FET N2 is coupled to a connection point between the drain of the FET P3 and the source of the FET P1.

The gate of the FET P3 is coupled to the drain of the FET P13 on the right side. The gate of FET P13 is coupled to the drain of the FET P3.

The condenser C0 is coupled to the source of the FET P1 and the source of the FET N1 constituting the inverter circuit. In other words, the condenser C0 is connected in parallel to the inverter constituted by the FET P1 and the FET N1.

A connection point between the gate of the FET P0 and the gate of the FET N0 may be coupled to the input terminal of the inverter I. A connection point between the gate of the FET P10 and the gate of the FET N10 may be coupled to the output terminal of the inverter I. The input signal IN1 is fed into the input terminal of the inverter I. In other words, an input signal bIN1 complementary to the input signal IN1 is fed into the connection point between the gate of the FET P10 and the gate of the N10.

A connection point between the drain of the FET P13 and the drain of the FET N12 on the right side is an output point for an output signal OUT1. The output signal OUT1 is switched between the high voltage VPP and the middle voltage VMID. In other words, the output signal OUT1 has amplitude (VPP-VMID).

A connection point between the drain of the FET P10 and the drain of the FET N10 on the right side is an output point for an output signal OUT2. The output signal OUT2 has amplitude (VDD-VSS).

A connection point between the drain of the FET P11 and the drain of the FET N11 on the right side is an output point for an output signal OUT4. The output signal OUT4 has amplitude (VPP-VSS).

The source of the FET P12 on the right side is an output point for an output signal OUT5. The output signal OUT5 has amplitude (VPP-VMID).

Note that the level shifter 100 shown in FIG. 4 includes output points for output signals bOUT1, bOUT2, bOUT4 and bOUT5 in a complementary relationship with the output signals OUT1, OUT2, OUT4 and OUT5, respectively.

The low voltage VDD is constantly applied to the gates of the FETs N1 and N11. The middle voltage VMID is also constantly applied to the gates of the FETs P1, P2, P11, and P12.

Here, the gate of the FET P3 is coupled to the output point for the output signal OUT1 and the gate of the FET N2 is coupled to the output point for the output signal OUT5. Similarly, the gate of the FET P13 is coupled to the output point for the output signal bOUT1 and the gate of the FET N12 is coupled to the output point for the output signal bOUT5.

In various embodiments, the FETs P3, N2, P13, N12 may be arranged as a cross-coupled latch configuration. That is to say, without the FETs P2, P12, the gates of the FETs P3, N2 may be coupled to the output point for the output signal OUT1, and the gates of the FETs P13, N12 may be coupled to the output point for the output signal bOUT1. However, this cross-coupled latch configuration is intrinsically metastable. Further, the cascode devices, i.e. the FET P1 connected to the output point for the bOUT1 and the FET P11 connected to the output point for the OUT1 may be in weak ON states. Since a pull-down capability of the FETs P1, P11 is low, the cross-coupled latch configuration may not work properly or may get stuck in an undesired state. Note that increasing channel widths of the FETs P1, P11 is not applicable because it enlarges areas of the FETs P1, P11. In the configuration shown in FIG. 4, the FETs P2, P12 are provided as another path to drive the FETs N2, N12, respectively. This enables to improve the stability of the operation of an area including the FETs P3, N2, P13, N12.

Note that the p-channel FET P3 is an example of a first p-channel FET. The p-channel FET P1 is an example of a second p-channel FET. The p-channel FET P2 is an example of a third p-channel FET. The p-channel FET P0 is an example of a fourth p-channel FET. The n-channel FET N1 is an example of a first n-channel FET. The n-channel FET N0 is an example of a second n-channel FET. The n-channel FET N2 is an example of a third n-channel FET. The condenser C0 is an example of a first condenser.

The p-channel FET P13 is an example of a fifth p-channel FET. The p-channel FET P11 is an example of a sixth p-channel FET. The p-channel FET P12 is an example of a seventh p-channel FET. The p-channel FET P10 is an example of a eighth p-channel FET. The n-channel FET N11 is an example of a fourth n-channel FET. The n-channel FET N10 is an example of a fifth n-channel FET. The n-channel FET N12 is an example of a sixth n-channel FET. The condenser C10 is an example of a second condenser.

The input terminal of the inverter I is an example of an inverter input terminal. The output terminal of the inverter I is an example of an inverter output terminal. The connection point between the drain of the FET P13 and the source of the FET P11 is an example of a first output terminal. The connection point between the drain of the FET N10 and the source of the FET N11 is an example of a second output terminal.

Figure 5:
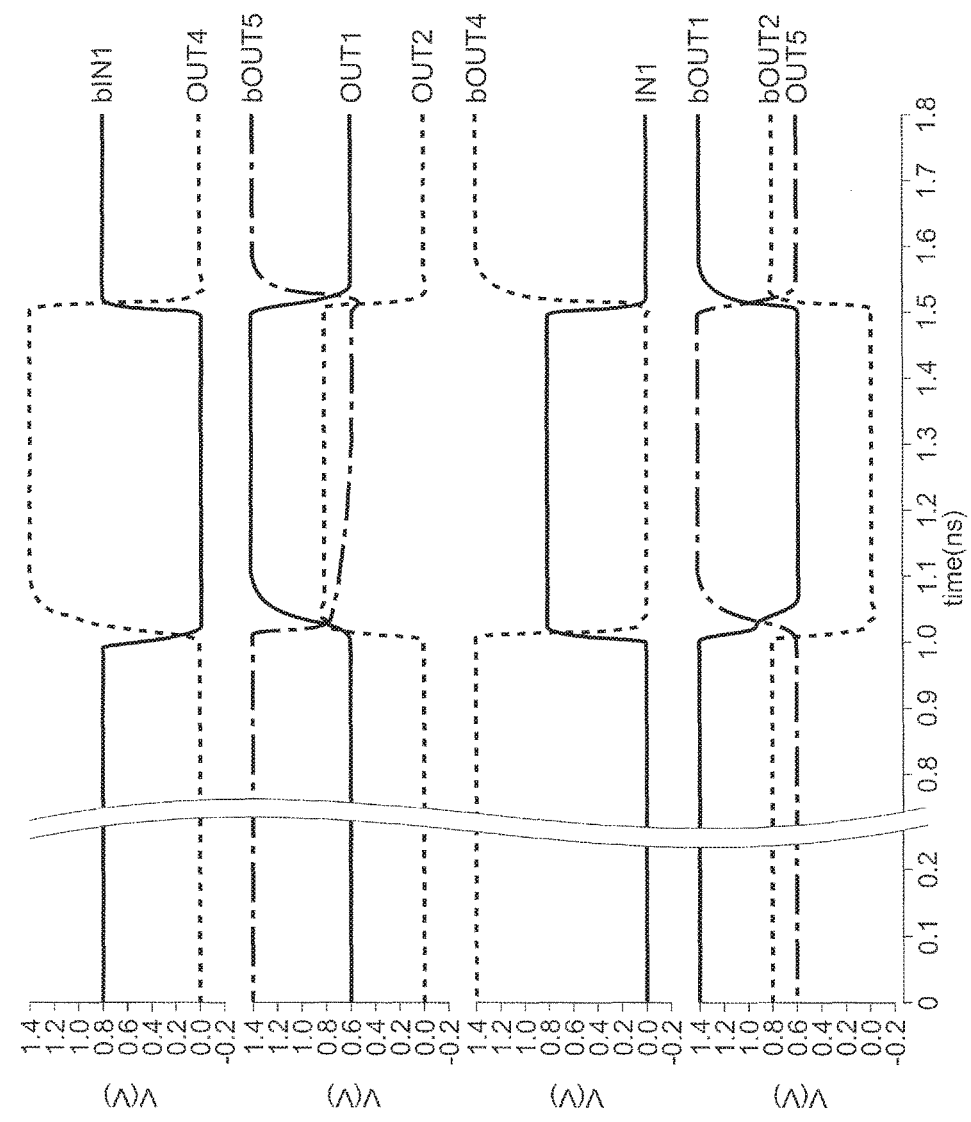
FIG. 5 is a timing chart of the operation of the level shifter according to the embodiment.

FIG. 5 is a timing chart of the operation of the level shifter 100 according to the embodiment. The horizontal axis indicates time (ns). The vertical axis indicates voltages of the input signals IN1, bIN1 and the output signals OUT1, OUT2, OUT4, OUT5, bOUT1, bOUT2, bOUT4, and bOUT5.

Referring to FIG. 5, the voltages may be as follows, for example: the high voltage VPP is 1.4 V, the low voltage VDD is 0.8 V, the reference voltage VSS is 0 V, and the middle voltage VMID is 0.6 V. Further, the level shifter 100 outputs the output signal OUT1 at the high voltage VPP (1.4 V) in a period from 1.0 ns to 1.5 ns, and outputs the middle voltage VMID (0.6 V) in the other period. It satisfies the requirement of the cascode driver 200.

Referring to FIG. 4 and FIG. 5, the operation of the level shifter 100 will be explained in detail.

At time 0.0 ns, the input signal IN1 is the reference voltage VSS (0 V) and the input signal bIN1 is the low voltage VDD (0.8 V).

The gates of the FET P10 and the FET N10 constituting the inverter circuit is applied with the low voltage VDD (0.8 V) so that the FET P10 is in the OFF state and the FET N10 is in the ON state. Then the output signal OUT2 becomes the reference voltage VSS (0 V). Then in the FET N11, the source is applied with the reference voltage VSS, and the gate is applied with the low voltage VDD so that the FET N11 is in the ON state. The output signal OUT4 becomes the reference voltage VSS (0 V).

Since the middle voltage VMID is applied to the gate of the FET P11, the output signal OUT1 decreases to the middle voltage VMID (0.6 V) if the output signal OUT1 has been the high voltage VPP (1.4 V).

Then the voltage applied to the gate of the FET P3 is switched from the high voltage VPP (1.4 V) to the middle voltage VMID (0.6 V). Further, the FET P3 turns ON and the output signal bOUT1 becomes the high voltage VPP (1.4 V). This causes the gate of the FET P13 to be switched to the high voltage VPP (1.4 V) and the FET P13 is turned OFF.

The gate of the FET P1 is applied with the middle voltage VMID (0.6 V) and the source of the FET P1 is applied with the high voltage VPP (1.4 V). This causes the FET P1 to be turned ON and the output signal bOUT4 becomes the high voltage VPP (1.4 V).

Since the middle voltage VMID is applied to the gate of the FET P2, the output signal bOUT5 increases to the high voltage VPP (1.4 V) if the output signal bOUT4 becomes the high voltage VPP (1.4 V). Further, the gate of the FET N12 is coupled to the output signal bOUT5. This causes the FET N12 to be turned ON and the output signal OUT1 is maintained at the middle voltage VMID (0.6 V).

Similarly, since the middle voltage VMID is applied to the gate of the FET P12, the output signal OUT5 falls to the middle voltage VMID (0.6 V) if the output signal OUT5 has been the high voltage VPP (1.4 V). Then the gate and the source of the FET N2 are applied with the middle voltage VMID. This causes the FET N2 to be turned OFF and the output signal bOUT1 is maintained at the high voltage VPP (1.4 V). Note that, by the double cross couplings between the FET P3 and the FET P13 and between the FET N2 and the FET N12, the output signal OUT1 is maintained to be the middle voltage VMID (0.6 V) and the output signal bOUT1 is maintained to be the high voltage VPP (1.4 V).

At time 1.0 ns, the input signal IN1 is switched from the reference voltage VSS (0 V) to the low voltage VDD (0.8 V) and the input signal bIN1 is switched from the low voltage VDD (0.8 V) to the reference voltage VSS (0 V). In other words, the input signals IN1 and bIN1 are exchanged with each other.

At time 1.5 ns, the input signal IN1 is switched from the low voltage VDD (0.8 V) to the reference voltage VSS (0 V) and the input signal bIN1 is switched from the reference voltage VSS (0 V) to the low voltage VDD (0.8 V). In other words, the state returns to the one at time 0.0 ns. A detailed explanation regarding the operations (the status) of each device in the level shifter 100 after time 1.0 ns will be omitted.

When the input signal IN1 changes between the reference voltage VSS (0 V) and the low voltage VDD (0.8 V), the output signal OUT2 changes between the reference voltage VSS (0 V) and the low voltage VDD (0.8 V). Similarly, the output signal OUT4 changes between the high voltage VPP (1.4 V) and the reference voltage VSS (0 V) and the output signal OUT5 changes between the middle voltage VMID (0.6 V) and the high voltage VPP (1.4 V).

The output signals bOUT1, bOUT2, bOUT4, and bOUT5 change in the direction opposite to the changing of the output signals OUT1, OUT2, OUT4, and OUT5, respectively.

Hereinafter, voltages between the source, the drain and the gate of the device with the high voltage VPP being applied will be explained.

At time 0.0 ns, the output signal bOUT4 and the output signal bOUT1 is the high voltage VPP (1.4 V). In the FET N1, the drain is applied with the output signal bOUT4 (1.4 V), and the gate and the source are applied with the low voltage VDD (0.8 V). Then a voltage between the gate and the source, i.e. a gate-to-source voltage, is 0 V, a voltage between the gate and the drain, i.e. a gate-to-drain voltage, is 0.6 V, and a voltage between the source and the drain, i.e. a source-to-drain voltage, is 0.6 V.

Similarly, in the FET P1, the drain is applied with the output signal bOUT4 (1.4 V), the gate is applied with the middle voltage VMID (0.6 V), and the source is applied with the high voltage VPP (1.4 V). Then the gate-to-source voltage is 0.8 V, the gate-to-drain voltage is 0.8 V, and the source-to-drain voltage is 0 V.

In the FET P3, the source is applied with the high voltage VPP (1.4 V), the drain is applied with the output signal bOUT1 at the high voltage VPP (1.4 V), the gate is applied with the output signal OUT1 at the middle voltage VMID (0.6 V). Then the gate-to-source voltage is 0.8 V, the gate-to-drain voltage is 0.8 V, and the source-to-drain voltage is 0 V.

In the FET N2, the source is applied with the middle voltage VMID (0.6 V), the drain is applied with the output signal bOUT1 at the high voltage VPP (1.4 V), the gate is applied with the output signal OUT5 at the middle voltage VMID (0.6 V). Then the gate-to-source voltage is 0 V, the gate-to-drain voltage is 0.8 V, and the source-to-drain voltage is 0.8 V.

In the FET P13, the source is applied with the high voltage VPP (1.4 V), the gate is applied with the output signal bOUT1 at the high voltage VPP (1.4 V), the drain is applied with the output signal OUT1 at the middle voltage VMID (0.6 V). Then the gate-to-source voltage is 0 V, the gate-to-drain voltage is 0.8 V, and the source-to-drain voltage is 0.8 V.

As mentioned above, the FETs constituting the level shifter 100 may be applied with the high voltage VPP (1.4 V). However, every voltage between the gate and the source, the gate and the drain, and the source and the drain is equal to or lower than the low voltage VDD (0.8 V), which is an allowable voltage for the thin-oxide technology. This structure may prevent the level shifter 100 from shortening its lifetime. Note that the FETs P1, P11, N1, and N11 are cascode devices. Note that in one point of view, the level shifter 100 may be regarded as a wide operating voltage range high speed cascode complimentary dual level shifter.

Figure 6:
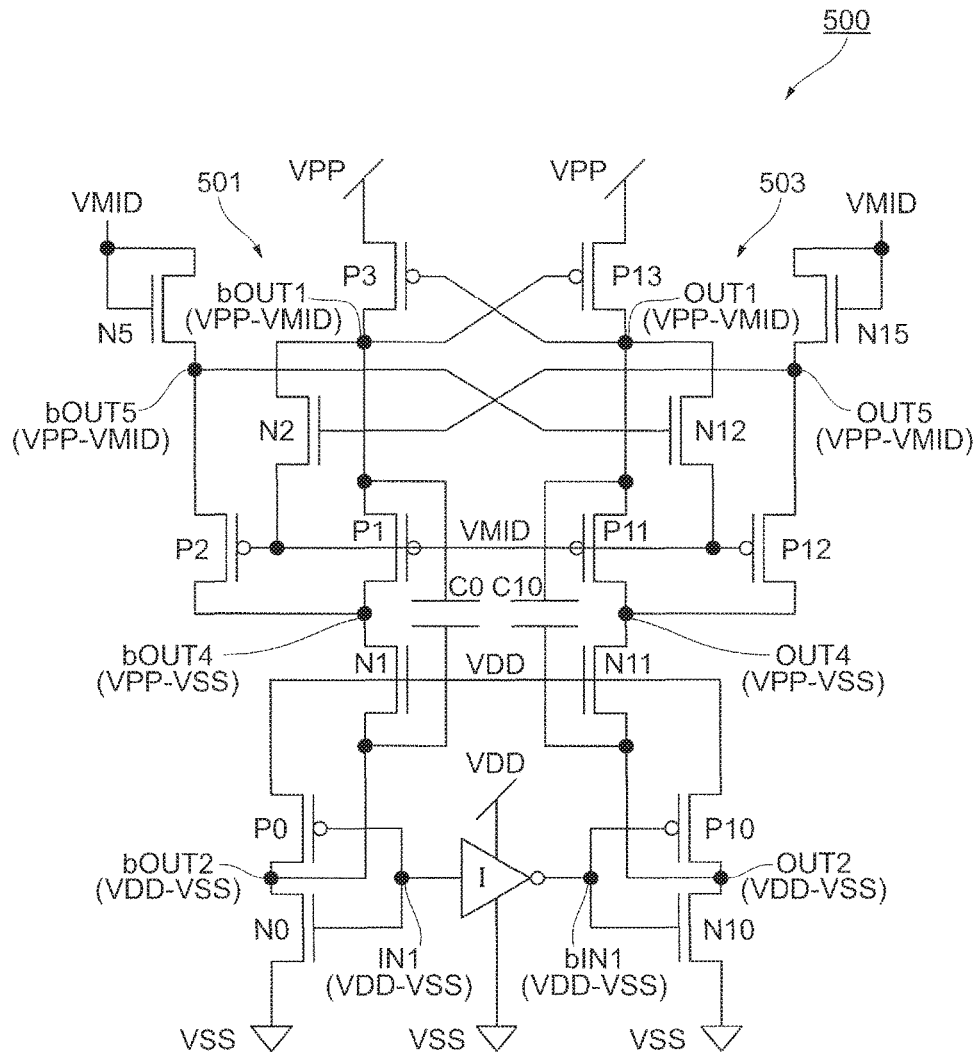
FIG. 6 is a circuit diagram of a level shifter according to an alternative embodiment.

FIG. 6 is a circuit diagram of a level shifter 500 according to an alternative embodiment. Referring to FIG. 6, the same structures as those of the exemplary embodiment shown in FIG. 4 are denoted by the same reference numerals, and the detailed explanation thereof will be omitted.

The level shifter 500 may include two n-channel FETs N5 and N15 in addition to the structure of the exemplary embodiment shown in FIG. 4. Similarly to the level shifter 100, the level shifter 500 may be constituted symmetrically. Note that the n-channel FET N5 is included in a first circuit section 501 and the n-channel FET N15 is included in a second circuit section 503.

The source of the FET N5 is coupled to a connection point between the source of the FET P2 and the gate of the FET N12. The middle voltage VMID is applied to the drain and the gate of the FET N5.

The source of the FET N15 is coupled to a connection point between the source of the FET P12 and the gate of the FET N2. The middle voltage VMID is applied to the drain and the gate of the FET N15.

In various embodiments, for example, the level shifter 100 as shown in FIG. 4 without the FETs N5 and N15 may be at time 1.0 ns of FIG. 5. When the input signal IN1 becomes the low voltage VDD from the reference voltage VSS, the FET N0 turns ON. This makes the output signals bOUT4 become the reference voltage VSS. Then, via the FET P2, the output signal bOUT5 goes down from the high voltage VPP to the middle voltage VMID. However, the output signal bOUT5 takes a relatively long time to go down to the middle voltage VMID since the FET P2 works as a source follower.

Therefore, the level shifter 500 as shown in FIG. 6 includes the FETs N5 and N15. The FET N5 provides the middle voltage VMID to the output bOUT5, and the FET N15 provides the middle voltage VMID to the output OUT5. These FETs N5 and N15 promote a speedup of the voltage change from the high voltage VPP to the middle voltage VMID at the outputs OUT5 and bOUT5.

The level shifter 500 including the FET N5 shifts the output signal bOUT5 to the middle voltage VMID faster than the level shifter 100. The FET N15 on the right side of the level shifter 500 performs a similar operation to the FET N5 on the left side.

In various embodiments, a standby state in which the input signal IN1 is the low voltage VDD. In this standby state, the FET N0 is in the ON state, and the output signal bOUT2 is the reference voltage VSS. This causes the output signal bOUT4 to be the reference voltage VSS through a cascode device, i.e. the FET N1, which is connected to the drain of another cascode device, i.e. the FET P2. The source of the FET P2 is connected to the output point for the output signal bOUT5. If the FET N5 is not provided, the output signal bOUT5 may go down to a threshold of the FET P2, because the FET P2 works as the source follower. This may cause the voltage between the gate and the drain of the FET N12 to exceed the low voltage VDD. In other words, the FET N5 of the alternative embodiment enables the output signal bOUT5 to settle at the middle voltage VMID. The same applies to the FET N15 of the second circuit section 503.

Figure 7:
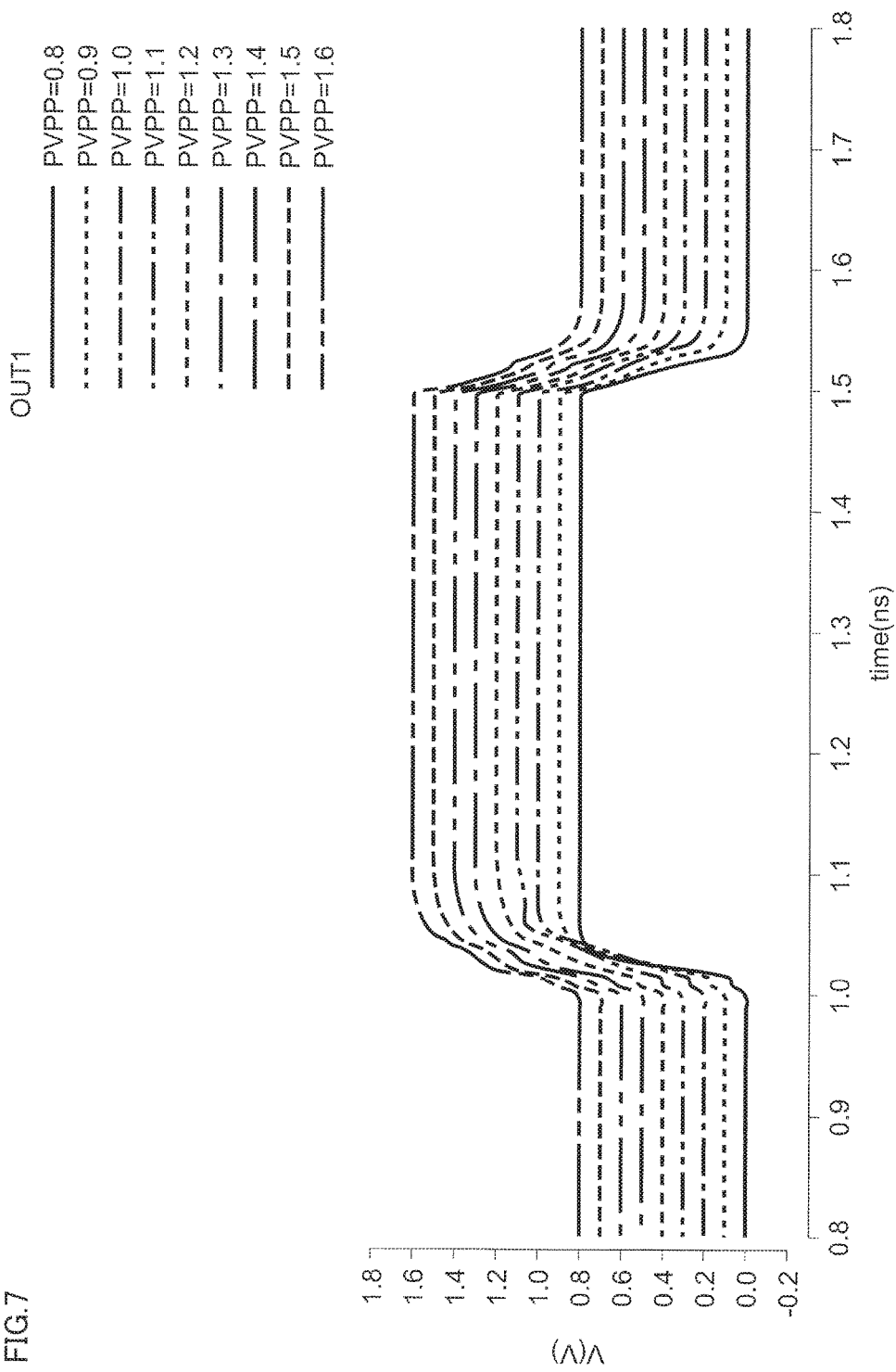
FIG. 7 shows level shift characteristics of the level shifter.
Figure 8:
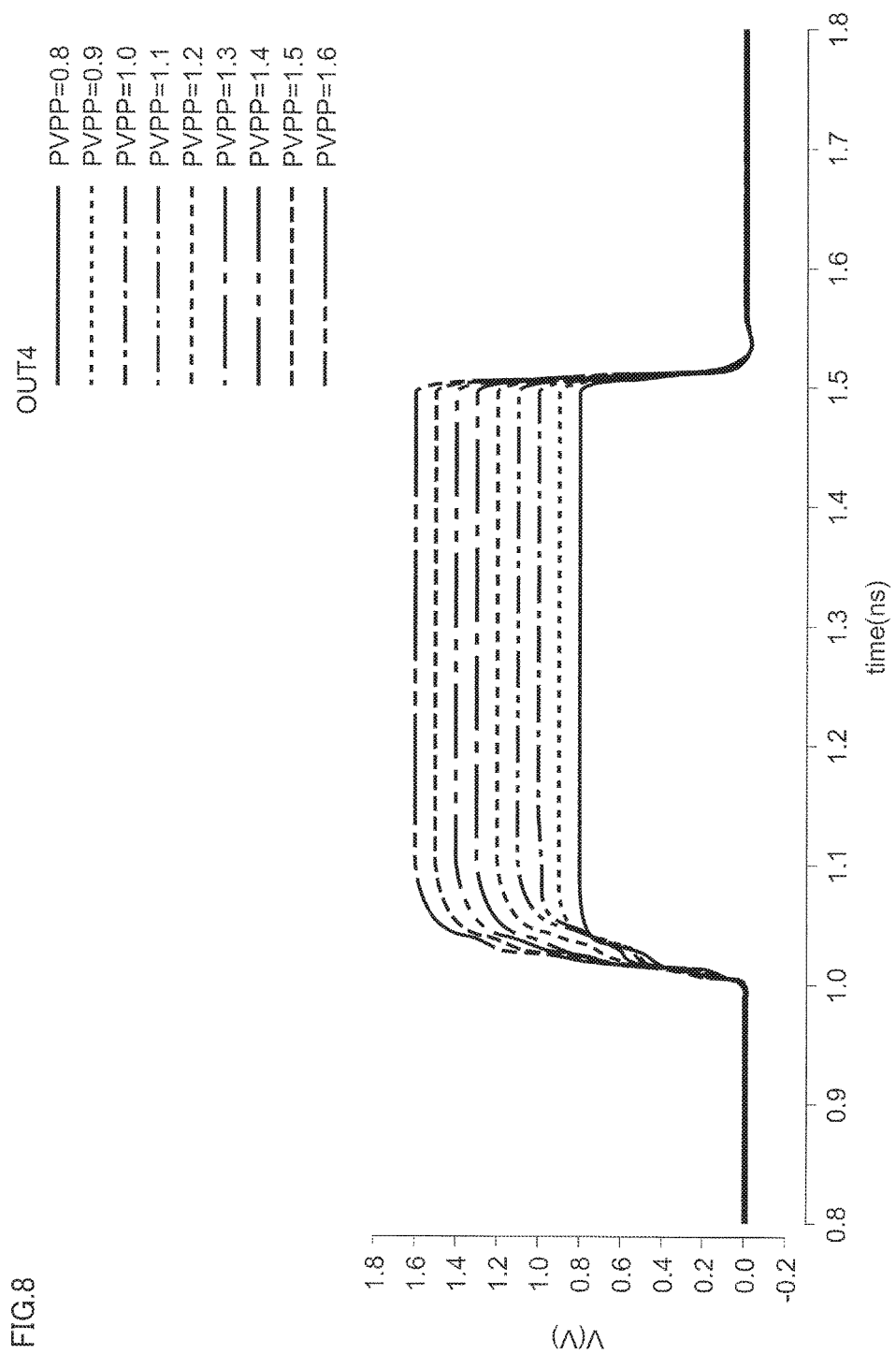
FIG. 8 shows level shift characteristics of the level shifter.

FIGS. 7 and 8 show level shift characteristics of the level shifter 500. More specifically, the FIGS. 7 and 8 respectively show the level shift of the output signals OUT1 and OUT4. In the FIGS. 7 and 8, the reference voltage is 0 V, the low voltage VDD is 0.8 V and the high voltage VPP is swept from 0.8 V to 1.6 V. The horizontal axes respectively indicate time (ns). The vertical axes respectively indicate voltages of the output signals OUT1 and OUT4.

As shown in FIG. 7, the voltage of the output signal OUT1 is shifted according to the sift of the high voltage VPP, and the amplitude of the output signal OUT1 is maintained at 0.8 V. Further, rise and fall of the output signal OUT1 are sufficiently rapid.

As shown in FIG. 8, the amplitude of the output signal OUT4 is shifted from 0.8 V to 1.6 V according to the sift of the high voltage VPP. Further, rise and fall of the output signal OUT4 are sufficiently rapid.

Figure 9:
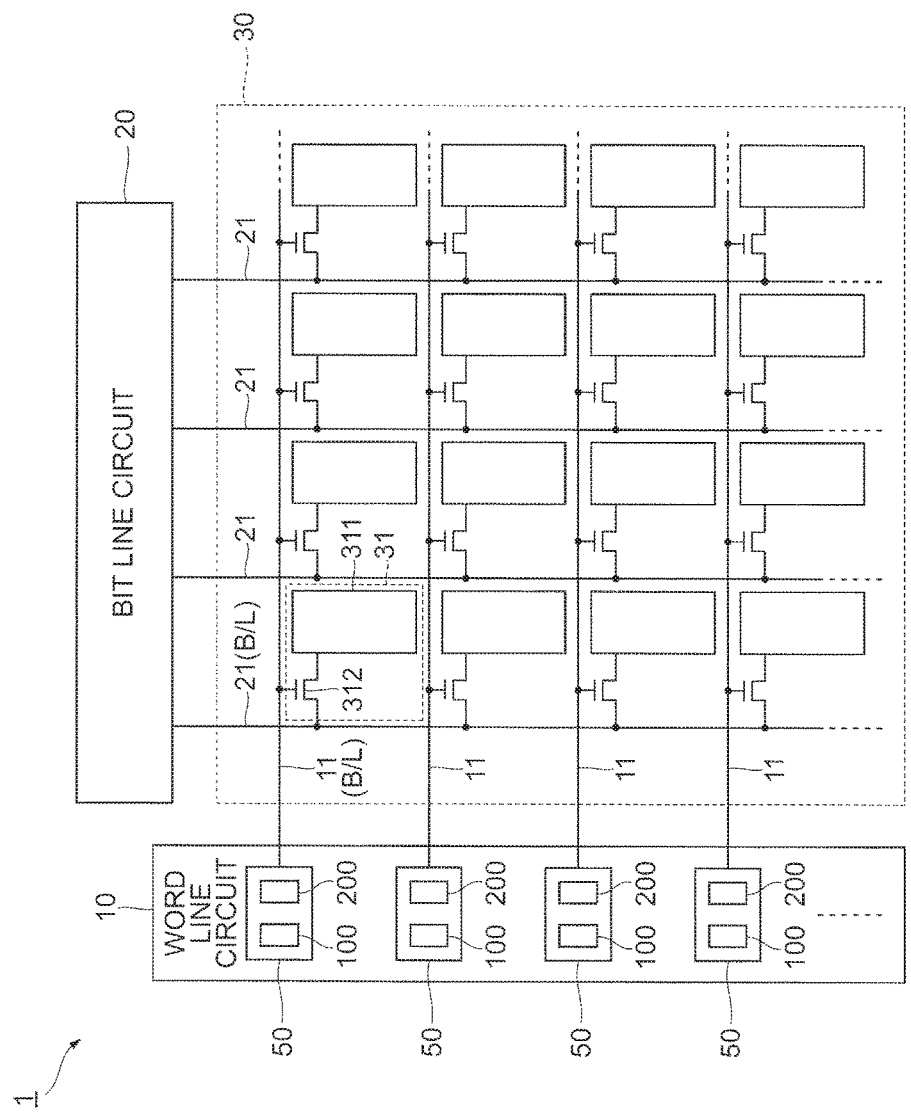
FIG. 9 is a circuit diagram of a dynamic random access memory according to an alternative embodiment.

FIG. 9 is a circuit diagram of a dynamic random access memory 1 according to an alternative embodiment. As shown in FIG. 9, a dynamic random access memory (DRAM) 1 may include a word line driver circuit 10, a bit line driver circuit 20, a memory cell array 30, word lines (W/L) 11 and bit lines (B/L) 21.

The memory cell array 30 includes multiple memory cells 31 arranged in an array. As shown in FIG. 1, the memory cells 31 are arranged in rows and columns. Each memory cell 31 may include a storage capacitor 311 and an access device 312 coupled to the storage capacitor 311. Each set of the storage capacitor 311 and the access device 312 is coupled in series between the corresponding word lines 11 and the corresponding bit lines 21. The storage capacitor 311 may be a capacitor in which information is stored. The access device 312 may be constituted by an FET. The access device 312 in the shown example is constituted as a silicon on insulator (SOI). In other words, the access device 312 is constituted with the thin-oxide technology to decrease a size of the access device 312 and increase a density of the DRAM 1.

The word line driver circuit 10 may include drivers (W/L drivers) 50. Each driver 50 includes a set of the level shifter 100 (500) and the cascode driver 200. Each driver 50 is connected to an end of the corresponding word line 11. The word line driver 10 drives the corresponding word line 11.

The bit line driver circuit 20 may include multiple bit drivers (not shown). Each bit driver is connected to an end of the corresponding bit line 21. The bit line driver circuit 20 inputs/outputs information (data) to/from the memory cells 31.

In the above alternative embodiment, the level shifters 100 (500) and the cascode drivers 200 are provided in the DRAM 1. Note that the DRAM 1 is an example of a memory device. In other words, the level shifters 100 (500) and the cascode drivers 200 are applicable to other types of the memory device.

In various embodiments, the level shifters 100 (500) and the cascode drivers 200 may be provided in a flash memory. The flash memory may include a floating gate in an access device. The flash memory may not include the storage capacitor 311.

In various embodiments, the level shifters 100 (500) and the cascode drivers 200 may be provided in a ferroelectric random access memory (FeRAM). The FeRAM may include a ferroelectric material (film) instead of the storage capacitor 311. In the FeRAM, the ferroelectric material may change the polarization according to the polarity of an applied voltage.

In various embodiments, the level shifters 100 (500) and the cascode drivers 200 may be provided in a magnetoresistive random access memory (MRAM). The MRAM may include a tunnel magneto resistance film instead of the storage capacitor 311. The MRAM utilizes a magnetoresistive effect changing an electroconductivity according to an angle of magnetization.

In various embodiments, the level shifters 100 (500) and the cascode drivers 200 may be provided in a phase change memory (PCM). The PCM may include a phase change material film instead of the storage capacitor 311. The PCM utilizes changing of a resistance according to a phase change.

In various embodiments, the level shifters 100 (500) and the cascode drivers 200 may be provided in a resistive random access memory (RRAM). The RRAM may include a strongly correlated electron system material instead of the storage capacitor 311. The RRAM utilizes a colossal electro-resistance (CER) effect changing an electric resistance widely by applying a voltage.

In various embodiments, the level shifters 100 (500) and the cascode drivers 200 may be provided in a liquid crystal display panel to control the liquid crystal pixels thereof.

In various embodiments, the level shifters 100 (500) and the cascode drivers 200 may be provided in an organic light emitting diode (OLED) display panel to control the OLED pixels thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A level shifter comprising:
a first circuit section,
a second circuit section in parallel with the first circuit section, and
an inverter between the first circuit section and the second circuit section, wherein the first circuit section comprises:
a first p-channel field effect transistor (FET), a second p-channel FET, a first n-channel FET, and a second n-channel FET connected to each other in series;
a third n-channel FET, a drain of the third n-channel FET being connected to a first connection point at which a drain of the first p-channel FET and a source of the second p-channel FET are connected to each other, a source of the third n-channel FET being connected to a gate of the second p-channel FET;
a third p-channel FET, a gate of the third p-channel FET being connected to a second connection point at which the source of the third n-channel FET and the gate of the second p-channel FET are connected to each other, a drain of the third p-channel FET being connected to a third connection point at which a drain of the second p-channel FET and a drain of the first n-channel FET are connected to each other;
a fourth p-channel FET, a source of the fourth p-channel FET being connected to a gate of the first n-channel FET, a drain of the fourth p-channel FET being connected to a fourth connection point at which a source of the first n-channel FET and a drain of the second n-channel FET are connected to each other; and
a first condenser, ends of the first condenser being respectively connected to a fifth connection point at which the drain of the first p-channel FET and the source of the second p-channel FET are connected to each other, and a sixth connection point at which the source of the first n-channel FET and the drain of the second n-channel FET are connected to each other;
wherein the second circuit section comprises:
a fifth p-channel FET, a sixth p-channel FET, a fourth n-channel FET, and a fifth n-channel FET connected in series, a gate of the fifth p-channel FET being connected to the drain of the first p-channel FET, a drain of the fifth p-channel FET being connected to a gate of the first p-channel FET, a gate of the sixth p-channel FET being connected to the gate of the second p-channel FET, a gate of the fourth n-channel FET being connected to the gate of the first n-channel FET;
a sixth n-channel FET, a drain of the sixth n-channel FET being connected to a seventh connection point at which the drain of the fifth p-channel FET and a source of the sixth p-channel FET are connected to each other, a source of the sixth n-channel FET being connected to the gate of the sixth p-channel FET;
a seventh p-channel FET, a gate of the seventh p-channel FET being connected to an eighth connection point at which the source of the sixth n-channel FET and the gate of the sixth p-channel FET are connected to each other, a drain of the seventh p-channel FET being connected to a ninth connection point at which a drain of the sixth p-channel FET and a drain of the fourth n-channel FET are connected to each other;
an eighth p-channel FET, a source of the eighth p-channel FET being connected to the gate of the fourth n-channel FET, a drain of the eighth p-channel FET being connected to a tenth connection point at which a source of the fourth n-channel FET and a drain of the fifth n-channel FET are connected to each other; and
a second condenser, ends of the second condenser being respectively connected to an eleventh connection point at which the drain of the fifth p-channel FET and the source of the sixth p-channel FET are connected to each other, and a twelfth connection point at which the source of the fourth n-channel FET and the drain of the fifth n-channel FET are connected to each other;
an inverter input terminal of the inverter is connected to a gate of the fourth p-channel FET and a gate of the second n-channel FET;
an inverter output terminal of the inverter is connected to a gate of the eighth p-channel FET and a gate of the fifth n-channel FET;
the seventh connection point constitutes a first output terminal;
the tenth connection point constitutes a second output terminal;
a first voltage is applied to a source of the first p-channel FET and a source of the fifth p-channel FET; and
a second voltage being lower than the first voltage is applied to a source of the second n-channel FET and a source of the fifth n-channel FET, the first voltage or a third voltage being lower than the first voltage and higher than the second voltage is outputted from the first output terminal, the second voltage or a fourth voltage being lower than the first voltage and higher than the third voltage is outputted from the second output terminal.

2. The level shifter according to claim 1, wherein the third voltage is applied to the gate of the second p-channel FET and the gate of the sixth p-channel FET.

3. The level shifter according to claim 1, wherein the fourth voltage is applied to the gate of the first n-channel FET and the gate of the fourth n-channel FET.

4. The level shifter according to claim 1, wherein the second voltage and the fourth voltage is applied to the inverter.

5. The level shifter according to claim 1, wherein the ninth connection point constitutes a third output terminal, the first voltage or the second voltage is outputted from the third output terminal based on an input signal applied to the inverter input terminal of the inverter.

6. The level shifter according to claim 1, further comprising:
   a seventh n-channel FET, a source of the seventh n-channel FET being connected to a thirteenth connection point at which a source of the third p-channel FET and a gate of the sixth n-channel FET are connected to each other, the third voltage being applied to a drain and a gate of the seventh n-channel FET and
   an eighth n-channel FET, a source of the eighth n-channel FET being connected to a fourteenth connection point at which a source of the seventh p-channel FET and a gate of the third n-channel FET are connected to each other, the third voltage being applied to a drain and a gate of the eighth n-channel FET.

7. A dynamic random-access memory (DRAM) comprising:
   a plurality of memories arranged in an array, each of the memories having at least an access field effect transistor (FET) and a storage capacitance;
   a driver for driving the memories, the driver coupled to each gate of corresponding memories; and
   a level shifter for sifting a voltage level to apply a voltage to the driver, the level shifter comprising:
      a first circuit section;
      a second circuit section in parallel with the first circuit section; and
      an inverter between the first circuit section and the second circuit section, wherein the first circuit section comprises:
         a first p-channel field effect transistor (FET), a second p-channel FET, a first n-channel FET, and a second n-channel FET connected to each other in series;
         a third n-channel FET, a drain of the third n-channel FET being connected to a first connection point at which a drain of the first p-channel FET and a source of the second p-channel FET are connected to each other, a source of the third n-channel FET being connected to a gate of the second p-channel FET;
         a third p-channel FET, a gate of the third p-channel FET being connected to a second connection point at which the source of the third n-channel FET and the gate of the second p-channel FET are connected to each other, a drain of the third p-channel FET being connected to a third connection point at which a drain of the second p-channel FET and a drain of the first n-channel FET are connected to each other;
         a fourth p-channel FET, a source of the fourth p-channel FET being connected to a gate of the first n-channel FET, a drain of the fourth p-channel FET being connected to a fourth connection point at which a source of the first n-channel FET and a drain of the second n-channel FET are connected to each other; and
         a first condenser, ends of the first condenser being respectively connected to a fifth connection point at which the drain of the first p-channel FET and the source of the second p-channel FET are connected to each other, and a sixth connection point at which the source of the first n-channel FET and the drain of the second n-channel FET are connected to each other;
      wherein the second circuit section comprises:
         a fifth p-channel FET, a sixth p-channel FET, a fourth n-channel FET, and a fifth n-channel FET connected in series, a gate of the fifth p-channel FET being connected to the drain of the first p-channel FET, a drain of the fifth p-channel FET being connected to a gate of the first p-channel FET, a gate of the sixth p-channel FET being connected to the gate of the second p-channel FET, a gate of the fourth n-channel FET being connected to the gate of the first n-channel FET;
         a sixth n-channel FET, a drain of the sixth n-channel FET being connected to a seventh connection point at which the drain of the fifth p-channel FET and a source of the sixth p-channel FET are connected to each other, a source of the sixth n-channel FET being connected to the gate of the sixth p-channel FET;
         a seventh p-channel FET, a gate of the seventh p-channel FET being connected to an eighth connection point at which the source of the sixth n-channel FET and the gate of the sixth p-channel FET are connected to each other, a drain of the seventh p-channel FET being connected to a ninth connection point at which a drain of the sixth p-channel FET and a drain of the fourth n-channel FET are connected to each other;
         an eighth p-channel FET, a source of the eighth p-channel FET being connected to the gate of the fourth n-channel FET, a drain of the eighth p-channel FET being connected to a tenth connection point at which a source of the fourth n-channel FET and a drain of the fifth n-channel FET are connected to each other; and
         a second condenser, ends of the second condenser being respectively connected to an eleventh connection point at which the drain of the fifth p-channel FET and the source of the sixth p-channel FET are connected to each other, and a twelfth connection point at which the source of the fourth n-channel FET and the drain of the fifth n-channel FET are connected to each other;
      an inverter input terminal of the inverter is connected to a gate of the fourth p-channel FET and a gate of the second n-channel FET;
      an inverter output terminal of the inverter is connected to a gate of the eighth p-channel FET and a gate of the fifth n-channel FET;
      the seventh connection point constitutes a first output terminal;
      the tenth connection point constitutes a second output terminal;

a first voltage is applied to a source of the first p-channel FET and a source of the fifth p-channel FET;

a second voltage being lower than the first voltage is applied to a source of the second n-channel FET and a source of the fifth n-channel FET;

the first voltage or a third voltage being lower than the first voltage and higher than the second voltage is outputted from the first output terminal; and the second voltage or a fourth voltage being lower than the first voltage and higher than the third voltage is outputted from the second output terminal.

8. The DRAM according to claim 7, wherein the third voltage is applied to the gate of the second p-channel FET and the gate of the sixth p-channel FET.

9. The DRAM according to claim 7, wherein the fourth voltage is applied to the gate of the first n-channel FET and the gate of the fourth n-channel FET.

10. The DRAM according to claim 7, wherein the second voltage and the fourth voltage is applied to the inverter.

11. The DRAM according to claim 7, wherein the ninth connection point constitutes a third output terminal, the first voltage or the second voltage is outputted from the third output terminal based on an input signal applied to the inverter input terminal of the inverter.

12. The DRAM according to claim 7, further comprising:
a seventh n-channel FET, a source of the seventh n-channel FET being connected to a thirteenth connection point at which a source of the third p-channel FET and a gate of the sixth n-channel FET are connected to each other, the third voltage being applied to a drain and a gate of the seventh n-channel FET; and an eighth n-channel FET, a source of the eighth n-channel FET being connected to a fourteenth connection point at which a source of the seventh p-channel FET and a gate of the third n-channel FET are connected to each other, the third voltage being applied to a drain and a gate of the eighth n-channel FET.

13. A level shifter comprising:
an inverter between a first circuit section and a second circuit section, wherein the first circuit section comprises:
a first p-channel field effect transistor (FET), a second p-channel FET, a first n-channel FET, and a second n-channel FET connected to each other in series;
a third n-channel FET, a drain of the third n-channel FET being connected to a first connection point at which a drain of the first p-channel FET and a source of the second p-channel FET are connected to each other, a source of the third n-channel FET being connected to a gate of the second p-channel FET;
a third p-channel FET, a gate of the third p-channel FET being connected to a second connection point at which the source of the third n-channel FET and the gate of the second p-channel FET are connected to each other, a drain of the third p-channel FET being connected to a third connection point at which a drain of the second p-channel FET and a drain of the first n-channel FET are connected to each other;
a fourth p-channel FET, a source of the fourth p-channel FET being connected to a gate of the first n-channel FET, a drain of the fourth p-channel FET being connected to a fourth connection point at which a source of the first n-channel FET and a drain of the second n-channel FET are connected to each other; and
a first condenser, ends of the first condenser being respectively connected to a fifth connection point at which the drain of the first p-channel FET and the source of the second p-channel FET are connected to each other, and a sixth connection point at which the source of the first n-channel FET and the drain of the second n-channel FET are connected to each other;

wherein the second circuit section comprises:
a fifth p-channel FET, a sixth p-channel FET, a fourth n-channel FET, and a fifth n-channel FET connected in series, a gate of the fifth p-channel FET being connected to the drain of the first p-channel FET, a drain of the fifth p-channel FET being connected to a gate of the first p-channel FET, a gate of the sixth p-channel FET being connected to the gate of the second p-channel FET, a gate of the fourth n-channel FET being connected to the gate of the first n-channel FET;

a sixth n-channel FET, a drain of the sixth n-channel FET being connected to a seventh connection point at which the drain of the fifth p-channel FET and a source of the sixth p-channel FET are connected to each other, a source of the sixth n-channel FET being connected to the gate of the sixth p-channel FET;

a seventh p-channel FET, a gate of the seventh p-channel FET being connected to an eighth connection point at which the source of the sixth n-channel FET and the gate of the sixth p-channel FET are connected to each other, a drain of the seventh p-channel FET being connected to a ninth connection point at which a drain of the sixth p-channel FET and a drain of the fourth n-channel FET are connected to each other;

an eighth p-channel FET, a source of the eighth p-channel FET being connected to the gate of the fourth n-channel FET, a drain of the eighth p-channel FET being connected to a tenth connection point at which a source of the fourth n-channel FET and a drain of the fifth n-channel FET are connected to each other;

a seventh n-channel FET, a source of the seventh n-channel FET being connected to a thirteenth connection point at which a source of the third p-channel FET and a gate of the sixth n-channel FET are connected to each other, the third voltage being applied to a drain and a gate of the seventh n-channel FET; and an eighth n-channel FET, a source of the eighth n-channel FET being connected to a fourteenth connection point at which a source of the seventh p-channel FET and a gate of the third n-channel FET are connected to each other, the third voltage being applied to a drain and a gate of the eighth n-channel FET; and a second condenser, ends of the second condenser being respectively connected to an eleventh connection point at which the drain of the fifth p-channel FET and the source of the sixth p-channel FET are connected to each other, and a twelfth connection point at which the source of the fourth n-channel FET and the drain of the fifth n-channel FET are connected to each other;

an inverter input terminal of the inverter is connected to a gate of the fourth p-channel FET and a gate of the second n-channel FET;

an inverter output terminal of the inverter is connected to a gate of the eighth p-channel FET and a gate of the fifth n-channel FET;

the seventh connection point constitutes a first output terminal;

the tenth connection point constitutes a second output terminal;

a first voltage is applied to a source of the first p-channel FET and a source of the fifth p-channel FET; and a second voltage being lower than the first voltage is applied to a source of the second n-channel FET and a source of the fifth n-channel FET, the first voltage or a third voltage being lower than the first voltage and higher than the second voltage is outputted from the first output terminal, the second voltage or a fourth voltage being lower than the first voltage and higher than the third voltage is outputted from the second output terminal.

14. The level shifter according to claim 13, wherein the third voltage is applied to the gate of the second p-channel FET and the gate of the sixth p-channel FET.

15. The level shifter according to claim 13, wherein the fourth voltage is applied to the gate of the first n-channel FET and the gate of the fourth n-channel FET.

16. The level shifter according to claim 13, wherein the second voltage and the fourth voltage is applied to the inverter.

17. The level shifter according to claim 13, wherein the ninth connection point constitutes a third output terminal, the first voltage or the second voltage is outputted from the third output terminal based on an input signal applied to the inverter input terminal of the inverter.

* * * * *